United States Patent
Goto

(10) Patent No.: US 6,184,094 B1
(45) Date of Patent: Feb. 6, 2001

(54) METHOD FOR PRODUCING SEMICONDUCTOR DEVICE

(75) Inventor: Yoshiro Goto, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/492,366

(22) Filed: Jan. 27, 2000

(30) Foreign Application Priority Data

Jan. 27, 1999 (JP) .................................................. 11-018290

(51) Int. Cl.[7] .................... H01L 21/8236; H01L 21/8234
(52) U.S. Cl. ............................ 438/276; 438/275; 438/289
(58) Field of Search .................................... 438/217, 232, 438/275, 276, 289, 291

(56) References Cited

U.S. PATENT DOCUMENTS

| | | | |
|---|---|---|---|
| 4,651,406 | * 3/1987 | Shimizu et al. | 438/217 |
| 5,243,210 | * 9/1993 | Naruke | 257/320 |
| 5,407,849 | * 4/1995 | Khambaty et al. | 438/217 |
| 5,966,321 | * 10/1999 | Kim | 365/156 |
| 5,989,949 | * 11/1999 | Kim et al. | 438/217 |
| 6,043,128 | * 3/2000 | Kamiya | 438/289 |

* cited by examiner

Primary Examiner—Charles Bowers
Assistant Examiner—Erik Kielin
(74) Attorney, Agent, or Firm—Foley & Lardner

(57) ABSTRACT

Producing method for a semiconductor device in which, for producing CMOS transistors of plural sorts, for example, dual power source transistors, having an added ROM unction, the number of times of ion implantation and resist pattern formation can be reduced to reduce the number of producing process steps. In producing a semiconductor device comprised of five sorts of MOS transistors, namely thin-film CMOS transistors (area A of FIG. 1), thick-film CMOS transistors (area B of FIG. 1) and an ROM code transistor (area C of FIG. 1), ion implantation for forming an inversion layer (13 of FIG. 1) on a channel surface of the ROM code transistor and the ion implantation for adjusting threshold value voltage of P channel of the CMOS transistor are carried out in the same process step (process (d) of FIG. 5). Also, the ion implantation for adjusting threshold value voltage of N channel of the thin-film CMOS transistor is effected using a resist pattern (4d of FIG. 6(g)) for the formation of a gate oxide film of the thin-film C MOS transistor (step (g) of FIG. 6).

7 Claims, 13 Drawing Sheets

F I G. 2 (a)
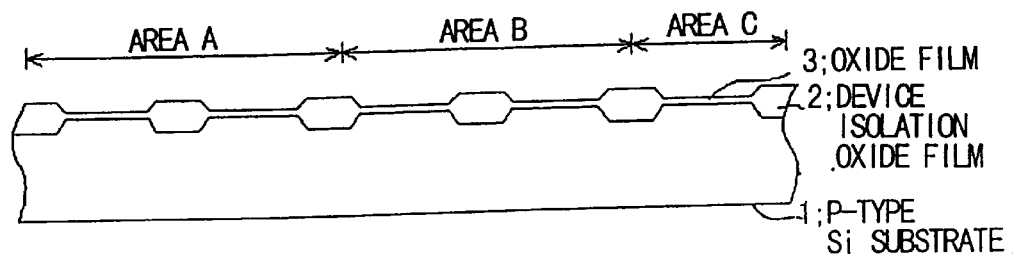
F I G. 2 (b)
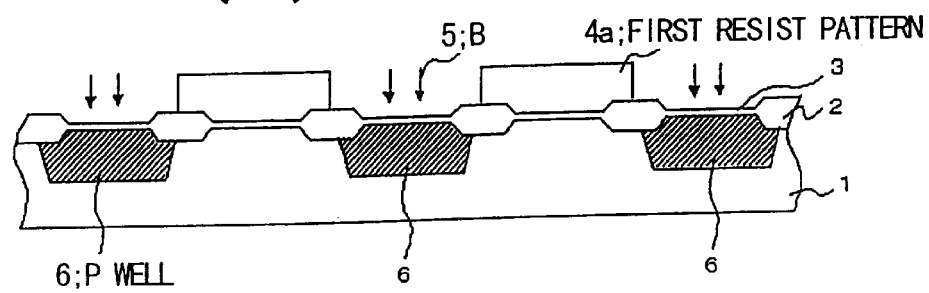
F I G. 2 (c)
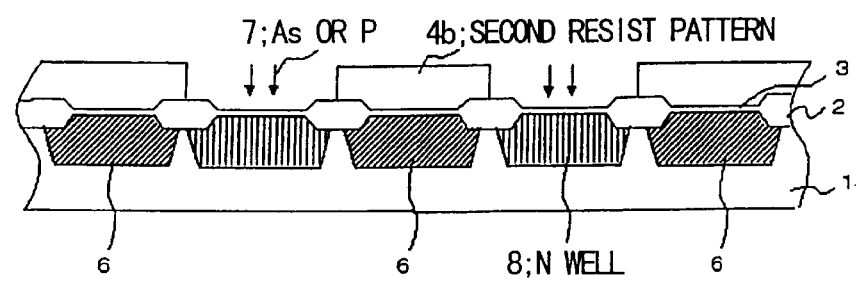
F I G. 2 (d)
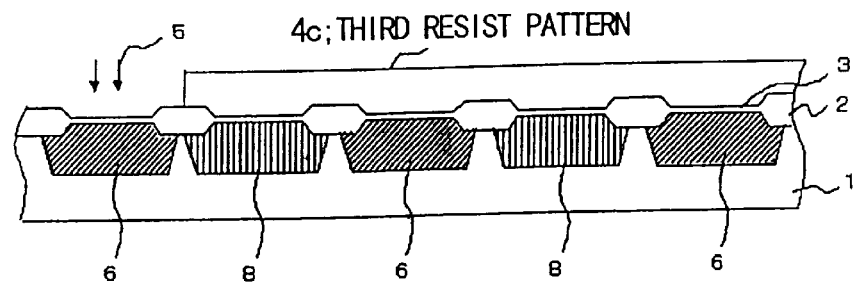

F I G. 4 ( i )
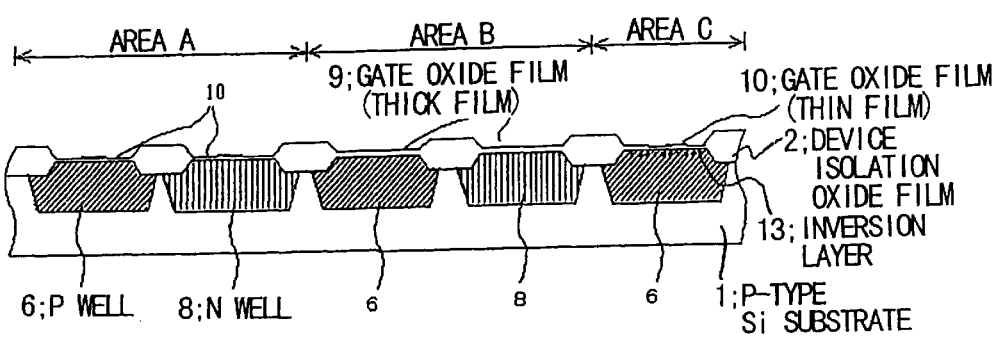
F I G. 4 ( j )
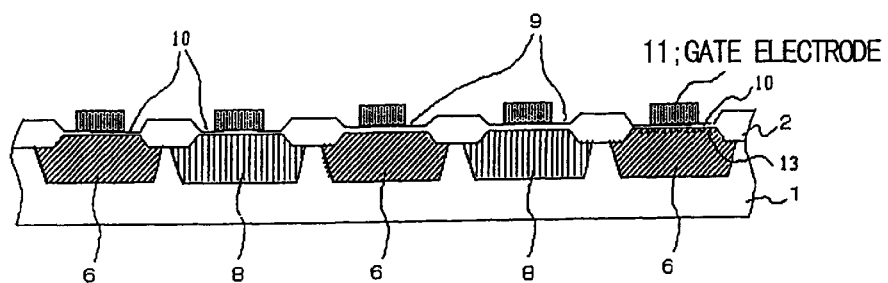

F I G. 7 (i)
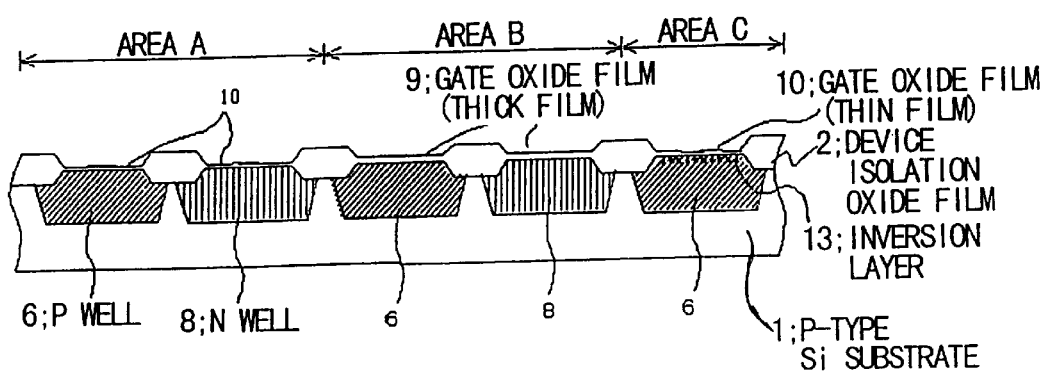
F I G. 7 (j)
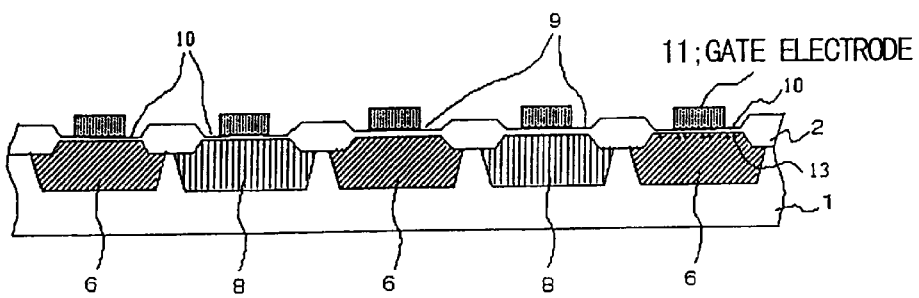

F I G. 1 1 (a) PRIOR ART
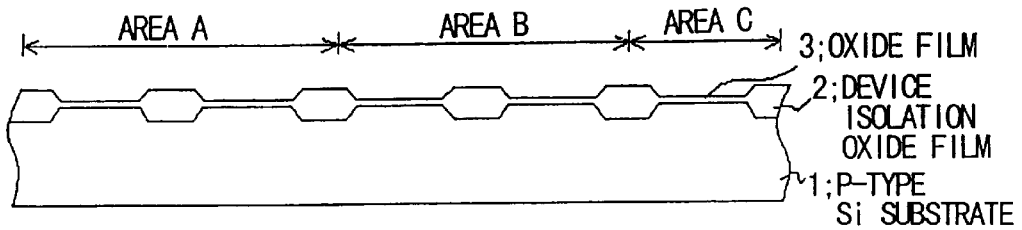
F I G. 1 1 (b) PRIOR ART
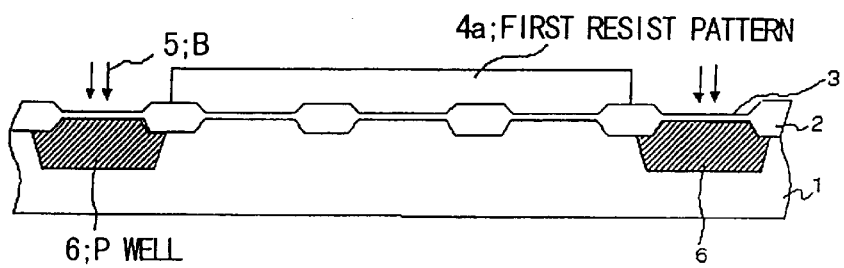
F I G. 1 1 (c) PRIOR ART
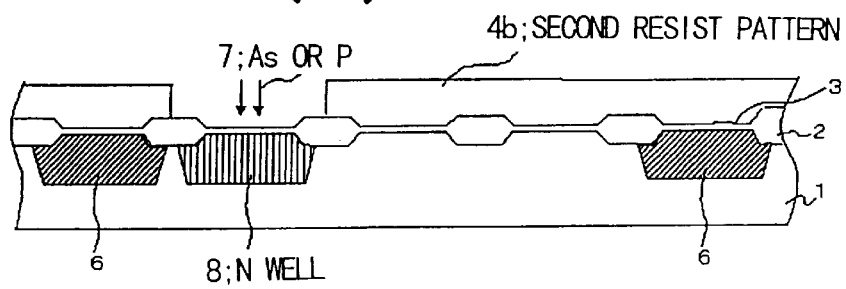
F I G. 1 1 (d) PRIOR ART
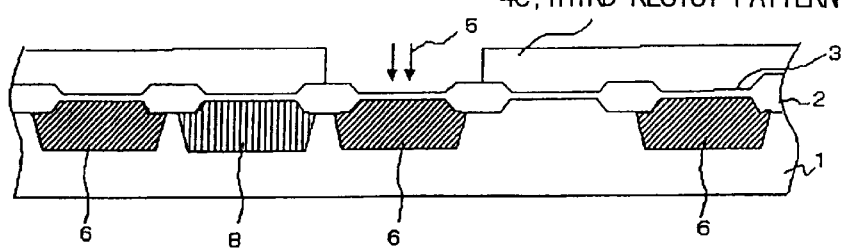

F I G. 1 2 (e)   PRIOR ART
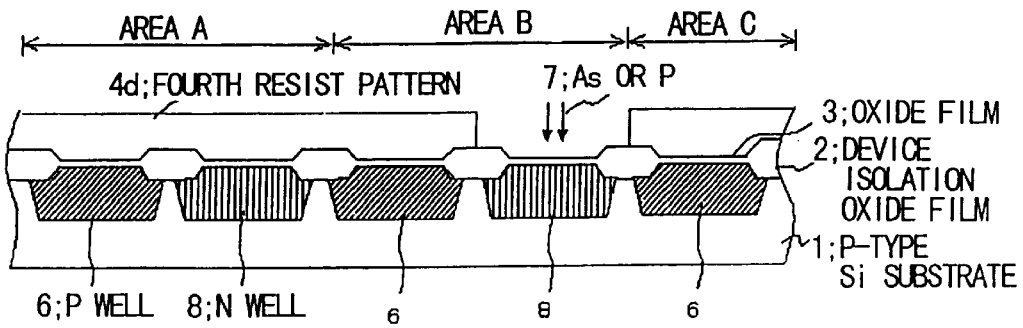
F I G. 1 2 (f)   PRIOR ART
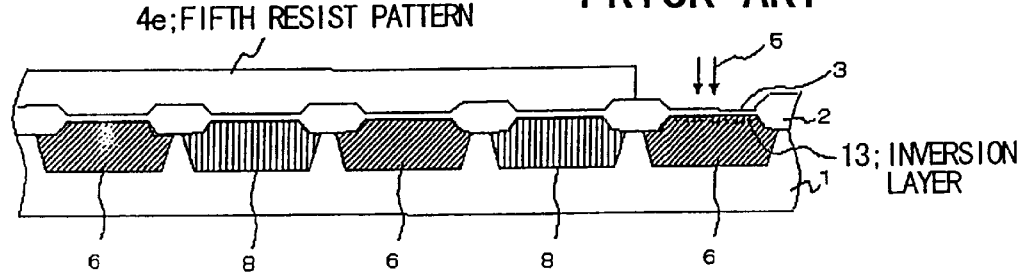
F I G. 1 2 (g)   PRIOR ART
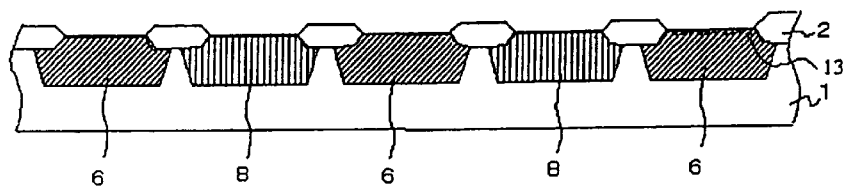
F I G. 1 2 (h)   PRIOR ART
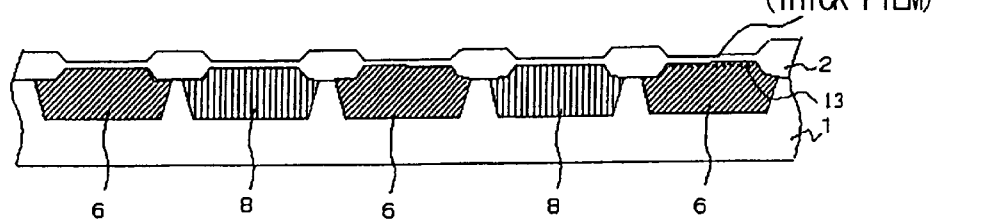

F I G. 1 3 (i) PRIOR ART
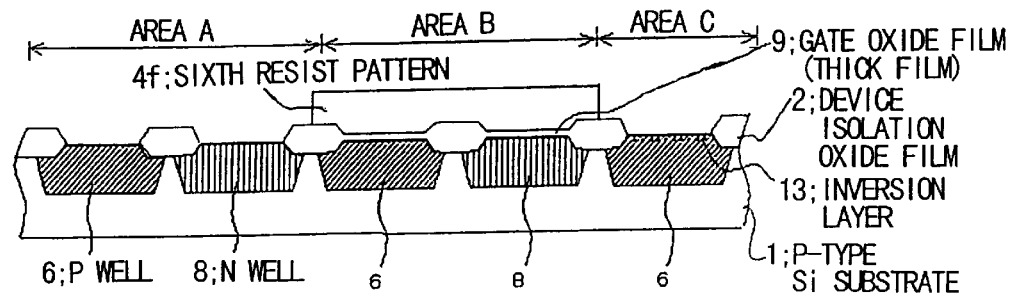
F I G. 1 3 (j) PRIOR ART
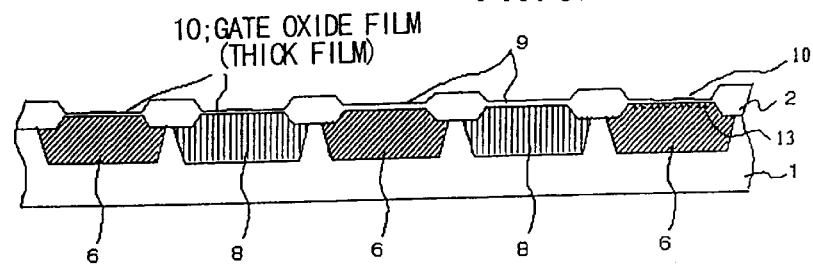
F I G. 1 3 (k) PRIOR ART
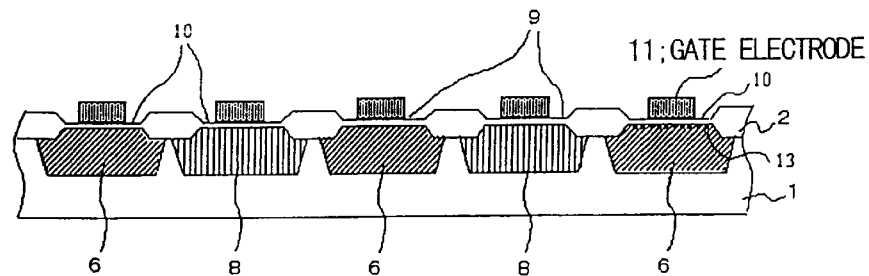

US 6,184,094 B1

METHOD FOR PRODUCING SEMICONDUCTOR DEVICE

FIELD OF THE INVENTION

This invention relates to a method for producing a semiconductor device and, more particularly, to a method for producing a semiconductor device made up of plural MOS transistors including ROM code transistors.

BACKGROUND OF THE INVENTION

In keeping pace with progress in the fine machining technology in the manufacture of semiconductor devices, the tendency is towards higher integration and higher speed of semiconductor devices, in particular the complementary insulated gate semiconductor devices (CMOS). For coping with this tendency, the driving power source is becoming lower. That is, while the power source of 5 V is routinely used, a composite transistor device partly incorporating built-in MOS transistors of a power voltage system with 3.3 V or 2.5 V or less is currently manufactured.

In such MOS transistors, it is necessary to form an element with a different film thickness of a gate insulating film because of the difference in the gate withstand voltage or in order to obtain desired electrical properties. Since the gate insulating films need to be of different film thicknesses, it is necessary to implant ions separately from one element of a given sort to another to control the concentration of impurities.

In a semiconductor integrated circuit, transistors having a ROM function for outputting specified output signals to a given input signal are occasionally assembled. In this case, it is necessary additionally to form resists or implant ions in order to constitute a ROM. Referring to the drawings, the producing method for a semiconductor device constituted by transistors having different film thicknesses of gate insulating films and the ROM function is explained.

FIG. 1 is a cross-sectional view for illustrating the structure of a CMOS transistor of a dual power source system having an added ROM function, whilst FIGS. 11 to 13 are cross-sectional views for schematically illustrating the conventional producing process for this sort of the semiconductor device. Meanwhile, FIGS. 11 to 13 show a sequence of the producing process, step-by-step, which process steps represent one sequence of the producing process, although shown split in three figures.

Referring first to FIG. 11(a), a diffusion layer area on a p-type silicon substrate 1 is divided by an isolation oxide film 2 by LOCOS, and an oxide film 3 is formed for surface protection. It is noted that areas A, B and C, indicated on top of FIG. 11(a), denote transistor forming regions. Specifically, A, B and C denote a thin film transistor area having a thin-film gate oxide film, a thick-film transistor area having a thick gate oxide film, and a ROM code transistor area, respectively. Here, explanation is made of the case of forming a thin-film N-channel MOS transistor as a ROM code transistor.

Then, as shown in FIG. 11(b), a first resist pattern 4a, which lays open an N-channel of the thin-film transistor (the left side of the area A) and the ROM code transistor, is formed, and ions, such as B+ (boron) are implanted plural times to form P wells 6 in the p-type silicon substrate 1, whilst a threshold value of the thin-film N-channel transistor is determined.

Then, ions are implanted to form wells of the P-channel of the thin-film transistor, and N and P channels of the thick-film transistor. As ion species, As+ (arsenic) or P+ (phosphorous) is used for the P-channel, whilst B+ (boron) is suited for the N-channel (see FIGS. 11 (c) to 12 (e)).

Then, a fifth resist pattern 4e, laying open only the ROM code transistor, as shown in FIG. 12(f), is formed, and P+ ions are implanted to form an inversion layer 13 on a surface region, to complete the formation of wells of the five MOS transistors. Then, as shown in FIG. 12(g), the oxide film 3, formed at step (a), is removed, and a gate oxide film 9 is formed on the entire substrate surface by a thermal oxidation method (see FIG. 12(h)).

Then, for adjusting the film thickness of the gate oxide film, a sixth resist pattern 4f, which has laid open only a thin-film transistor region (area A), and a ROM code transistor region (area C), is formed, as shown in FIG. 13i, and the gate oxide film 9 in the opened area is etched off. Then, a gate oxide film 10 of a film thickness matched to the thin film transistor is formed by a thermal oxidation method (see FIG. 13(j)). At this time, the gate oxide film 9 of the area B is additionally oxidized and increased in film thickness so as to be thicker than the gate oxide film 10. A gate electrode 11 then is formed to complete a basic structure of the above-described semiconductor device.

SUMMARY OF THE DISCLOSURE

However, if, with the above-described producing method for the semiconductor device, five sorts of wells with different concentrations of impurities, that is the P and N channels of the thick-film transistors, P and N channels of the thin-film transistors and the N channel of the ROM code transistor, are to be formed, it is necessary to form resist patterns six times, specifically, four times for forming the wells, once for forming the inversion layer 13 for the ROM code transistor and once for forming the gate oxide film of the thin-film transistor. Since the resist patterns are in need of various processings, such as resist coating, baking, light exposure to light and development, a large number of process steps are required for manufacture.

The present invention has been realized in view of the above-described problems. It is a primary object of the present invention to provide a producing method for a semiconductor device in which, in producing CMOS transistors of plural sorts having an added ROM function, such as dual power source type CMOS transistors, the number of times of ion implantation and formation of resist patterns is decreased to reduce the number of the producing process steps.

For accomplishing the above object, the present invention provides, in its one aspect, a method for producing a semiconductor device made up of a plurality of sorts of MOS transistors inclusive of an ROM code transistor, wherein ion implantation for forming an inversion layer on a channel surface of the ROM code transistor simultaneously serves as ion implantation for adjusting a threshold value voltage of one or more other sorts of MOS transistors than the ROM code transistor.

According to a second aspect of a present invention, there is provided a method for producing a semiconductor device made up of plural sorts of MOS transistors including a thin-film transistor, a thick-film transistor and a ROM code transistor, wherein ion implantation for forming an inversion layer on a channel surface of the ROM code transistor is performed in the same process step as ion implantation for adjusting a threshold value voltage of the thin-film transistor, and wherein the ion implantation for adjusting the threshold value voltage of the thin-film transistor is effected using a resist pattern used for forming a gate oxide film for the thin-film transistor.

According to a third aspect of the present invention, there is provided a method for producing a semiconductor device comprising:

(a) implanting an N channel area of a thin-film CMOS transistor, an N channel area of a thick-film CMOS transistor and an area of a ROM code transistor of a semiconductor device having at least five sorts of MOS transistors including thin-film CMOS transistors, thick-film CMOS transistors and the ROM code transistor, with a first ion species, using a first resist pattern as a mask, to form P wells, (b) implanting a P channel area of a thin-film CMOS transistor and a P channel of a thick-film CMOS transistor with a second ion species, using a second resist pattern as a mask, to form N wells, (c) additionally implanting the N channel area of the thin-film CMOS transistor with the first ion species, using a third resist pattern as a mask, and (d) implanting the P channel area of the thin-film CMOS transistor and the ROM code transistor area with the second ion species, using a fourth resist pattern as a mask, to form an inversion layer on the channel surface of the ROM code transistor, and to perform additional implantation in the P channel of the thin-film CMOS transistor.

According to a fourth aspect of the present invention, there is provided a method for producing a semiconductor device comprising:

(a) implanting an N channel area of a thin-film CMOS transistor, an N channel area of a thick-film CMOS transistor and an area of a ROM code transistor of a semiconductor device having at least five sorts of MOS transistors including at least a thin-film CMOS transistor, at least a thick-film CMOS transistor and the ROM code transistor, with a first ion species, using a first resist pattern as a mask, to form P wells, (b) implanting a P channel area of the thin-film CMOS transistor and a P channel of the thick-film CMOS transistor with a second ion species, using a second resist pattern as a mask, to form N wells, (c) implanting the P channel area of the thin-film CMOS transistor and the ROM code transistor area with the second ion species, using a third resist pattern as a mask, to form an inversion layer on the channel surface of the ROM code transistor, and simultaneously for performing additional implantation in the P channel of the thin-film CMOS transistor, (d) forming a thick gate oxide film on the entire surface of the substrate and forming a fourth resist pattern to cover only the thick CMOS transistors film, (e) implanting the first ion species, with the fourth resist pattern as a mask, for additional implantation in the N channel of the thin-film CMOS transistor, and removing the gate oxide films of the thin-film CMOS transistors and the ROM code transistor, using the fourth resist pattern, and (f) forming a thin gate oxide film on the thin-film CMOS transistors and the ROM code transistor.

According to a fifth aspect of the present invention, there is provided a method for producing a semiconductor device including (a) implanting an N channel area of a thin-film CMOS transistor, an N channel area of a thick-film CMOS transistor and an area of a ROM code transistor of a semiconductor device having at least five sorts of MOS transistors including a thin-film CMOS transistor, a thick-film CMOS transistor and the ROM code transistor, with a first ion species, using a first resist pattern as a mask, to form P wells, (b) implanting a P channel area of the thin-film CMOS transistor and a P channel of the thick-film CMOS transistor with a second ion species, using a second resist pattern as a mask, to form N wells, (c) additionally implanting the N channel area of the thin-film CMOS transistor with the first ion species, using a third resist pattern as a mask, (d) forming a thick gate oxide film on the entire surface of the substrate, and forming a fourth resist pattern to cover only the thick-film CMOS transistors, (e) implanting the second ion species, with the fourth resist pattern as a mask, for ion implantation for forming an inversion layer of the ROM code transistor and simultaneously for additional implantation of the P channel of the thin-film CMOS transistor, and subsequently removing the gate oxide films of the thin-film CMOS transistors and the ROM code transistor, and (f) forming thin gate oxide film on the thin-films CMOS transistor and the ROM code transistor.

BRIEF DESCRIPTION OF THE DRAWINGS

FIGS. 2(a)–2(d) are cross-sectional views for illustrating the process schematically illustrating a portion of the producing method of a semiconductor device according to a first embodiment of the present invention.

FIGS. 4(i)–4(j) are cross-sectional views for illustrating the process schematically illustrating still another portion of the producing method of a semiconductor device according to the first embodiment of the present invention.

FIGS. 7(i)–7(j) are cross-sectional views for illustrating the process schematically illustrating still another portion of the producing method of a semiconductor device according to the second embodiment of the present invention.

FIG. 11(a)–11(d) are cross-sectional views for illustrating the process illustrating a portion conventional producing method for a semiconductor device.

FIGS. 12(e)–12(h) are cross-sectional views for illustrating the process illustrating another portion of the conventional producing method for a semiconductor device.

FIGS. 13(i)–13(k) are cross-sectional views for illustrating the process illustrating still another portion of the conventional producing method for a semi conductor device.

PREFERRED EMBODIMENTS OF THE INVENTION

Figure 1:
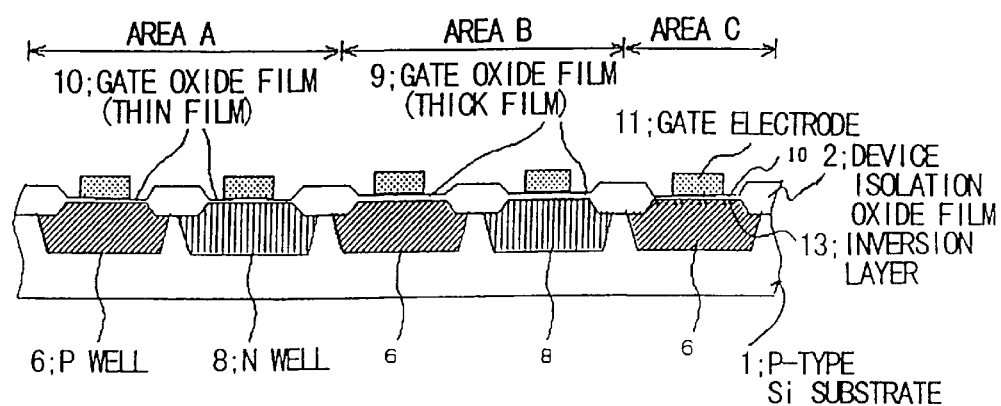
FIG. 1 is a cross-sectional view for illustrating the structure of a semiconductor device in which the thin-film and thick-film dual power source CMOS transistors co-exist with a ROM code transistor.

The present invention provides, in a preferred embodiment, a producing method for producing a semiconductor device comprised of five sorts of MOS transistors, namely thin-film CMOS transistors (area A of FIG. 1), thick-film CMOS transistors (area B of FIG. 1) and a ROM code transistor (area C of FIG. 1), an ion implantation for forming an inversion layer (13 of FIG. 1) on a channel surface of the ROM code transistor and an ion implantation for adjusting the threshold value voltage of the P channels of the thin-film CMOS transistors are carried out in the same process step (process (d) of FIG. 5). Also, the ion implantation for adjusting the threshold value voltage of the N channels of the thin-film CMOS transistors is effected using a resist pattern (4d of FIG. 6(g)) for the formation of a gate oxide film of the thin-film CMOS transistor (step (g) of FIG. 6). In this manner, concentrations of impurities on the channel surfaces of the five sorts of the MOS transistors are adjusted four times for of ion implantation operations and four times for resist pattern formation operations, to reduce the number of process steps.

EXAMPLES

For further elucidating the above-mentioned preferred embodiments of the present invention, examples of the present invention will be explained in more detail by referring to the drawings.

Figure 3:
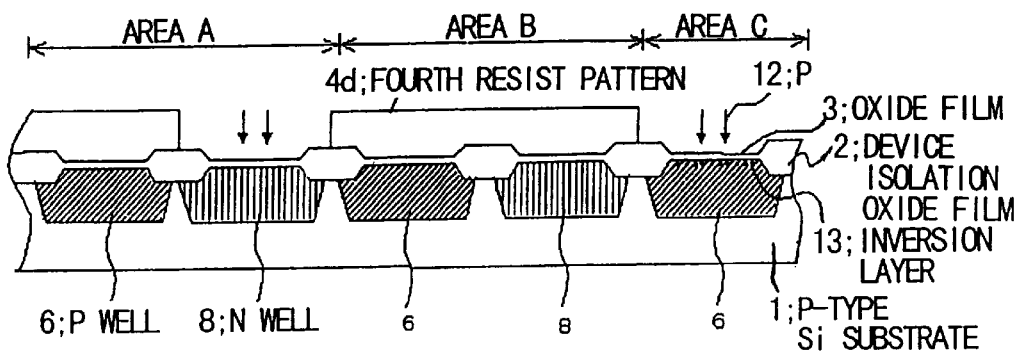
FIGS. 3(e)–3(h) are cross-sectional views for illustrating the process schematically illustrating another portion of the producing a method of a semiconductor device according to the first embodiment of the present invention.
Figure 3:
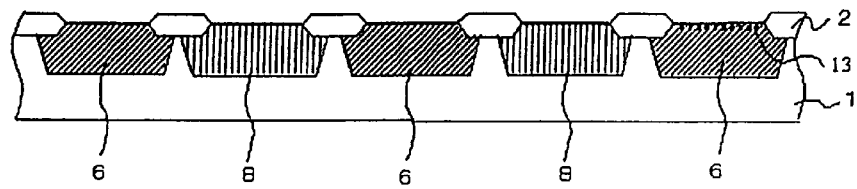
Figure 3:
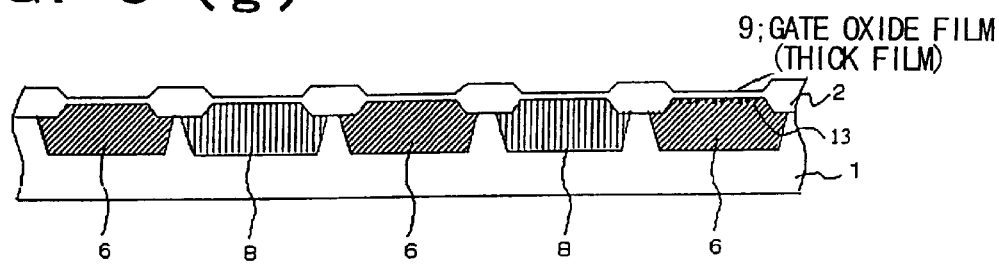
Figure 3:
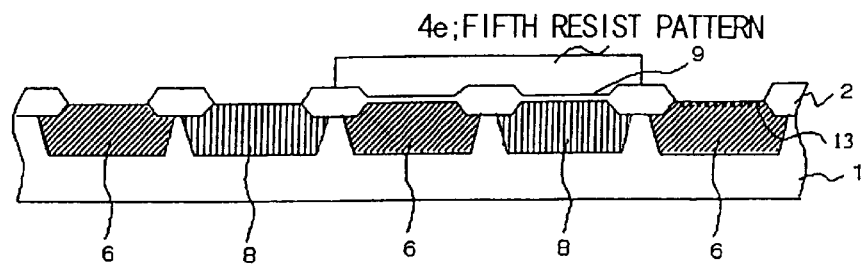

Referring first to FIGS. 1 to 4, the producing method for a semiconductor device according to a first example of the present invention is explained. FIG. 1 shows, in cross-section, the structure of a semiconductor device in which dual power source CMOS transistors and a sole ROM code transistor exist together and FIGS. 2 to 4 are cross-sectional views for illustrating the producing method of the semiconductor device. Although shown in the three views of FIGS. 2 to 4, the process steps represent a sole sequence of the producing process.

Referring to FIG. 1, the structure of a semiconductor device is explained. Area A is a thin-film transistor area, operating with a voltage of 3.3 V, area B is a thick-film transistor area, operating with a voltage of 5.0 V, and area C is a transistor area having the ROM function of outputting a specified output signal for a given input signal. In the present example, description is made of a process up to the formation of a gate electrode in the producing method for a semiconductor device in which dual power source CMOS transistors and a sole ROM code transistor exist together.

Referring to FIGS. 2 to 4, the producing method for the semiconductor device shown in FIG. 1 is explained. First, a device isolation oxide film, (referred to as "isolation oxide film") 2 is formed by a routine LOCOS method on a p-type silicon substrate 1, and an oxide film 3 is subsequently formed on the entire surface. This oxide film 3 performs the role of protecting the surface of the active area at the time of ion implantation for well formation, and is formed to a film thickness of the order of 10 nm to 20 nm by, for example, a thermal oxidation method.

Then, as shown in FIG. 2(b), a photoresist is coated on the entire surface, and a first resist pattern 4a then is formed, using a known photolithographic process, so as to lay open only an N-channel region of the thin-film transistor (the left side of the area A), an N-channel region of the thick-film transistor (the left side of the area B), and a ROM code transistor region (area C). Then, using a known ion implantation method, an ion species, such as boron 5, is implanted in the opening regions plural times, using variable implantation conditions, to form P wells 6 in the p-type silicon substrate 1.

Meanwhile, in the present example, p-wells are formed simultaneously in the thick-film transistor area and in the thin-film transistor area, and the concentrations of impurities are adjusted in a subsequent steps by additional implantation for the thin-film transistor side. Therefore, the ion implantation conditions are tuned in the present process to those for the thick-film transistor, such that, if the ion species is boron, it is implanted under a condition of an energy of the order of 200 keV and a dosage of the order of 2E13 cm$^{-2}$ to form the P wells, while being implanted under a condition of an energy of the order of 30 keV and a dosage of 2E12 cm$^{-2}$ to determine a threshold value of the N channels of the thick-film transistors.

Then, after the first resist pattern 4a is removed, a photoresist is again formed on the entire surface, as shown in FIG. 2(c). A second resist pattern 4b is then formed so as to lay open only the P channel regions of the thin-film transistors (the right side of the area A) and the P channel regions of the thick-film transistors (the right side of the area B). Arsenic or phosphorus 7 then is implanted plural times, under varied conditions, using the ion implantation method, to form N wells 8 in the P-type substrate 1. In this process, N wells are formed simultaneously in the thick-film transistor area and in the thin-film transistor area, and the thin film side is additionally implanted in a subsequent process.

Therefore, the ion implantation conditions are tuned to those for the thick-film transistor, such that, if the ion species is phosphorous, it is implanted under a condition of an energy of the order of 500 keV and a dosage of the order of 2E13 cm$^{-2}$ to form the N wells, while it is implanted under a condition of an energy of the order of 70 keV and the dosage of the order of 2E12 cm$^{-2}$ to determine the threshold value of the P-channel of the thick-film transistor.

Then, after the second resist pattern 4b is removed, a photoresist is again formed on the entire surface, as shown in FIG. 2(d). A third resist pattern 4c is then formed so as to lay open only the N channel region of the thin-film transistor and boron etc. is additionally implanted, using the ion implantation method. The concentration of impurities on the surface of the N-wells of the thin-film transistor is adjusted to obtain a desired threshold value of the thin-film transistor. The ion implantation conditions are set, e.g., to an energy of the order of 30 keV and the dosage of the order of 5E12 cm$^{-2}$ if the ion species is boron.

In the conventional method, ion implantation is again performed for adjusting the concentration of impurities on four different channel surface regions, namely P- and N-channels of the thin-film and thick-film transistors, after which a further ion implantation is carried out on the channel surfaces of the ROM code transistor for forming an inversion layer 13. In the present example, code phosphorous implantation in the ROM code transistor and additional implantation in the P-channel side of the thin-film transistor are carried out simultaneously.

That is, after removing the third resist pattern 4c, a photoresist is again coated on the entire surface, as shown in FIG. 3e, and a fourth photoresist pattern 4d then is formed so as to expose the P channel region of the thin-film transistor and the ROM code transistor region. Then, phosphorous 12 etc. is implanted to adjust the concentration of the impurities in the P channel region of the thin-film transistor and to form the inversion layer 13 on the P well surface of the ROM code transistor.

Whether the ROM code transistor is to be of the enhancement type or the depletion type is determined depending on what ROM code is to be formed, with the enhancement type and the depletion type co-existing for the entire ROM code transistor region. As for the portion (region) for forming the enhancement type, it would suffice if the ROM code transistor region also is protected with the resist pattern 4d so as to inhibit implantation of ion species.

Then, as shown in FIG. 3f, the fourth photoresist pattern 4d is removed, after which the oxide film 3 formed on the surface is removed using, for example, fluoric acid. Then, as shown in FIG. 3g, a gate oxide film 9 is formed on the entire surface to a film thickness of the order of, e.g., 10 nm. As for the thin-film transistor area and the ROM code transistor area, a gate oxide film is again formed in the subsequent process. Thus, in the present process step, the film thickness of the gate oxide film 9 is set so that the film thickness will correspond to that of the thick-film transistor.

A photoresist is again formed on the entire surface, after which a fifth resist pattern 4e is formed so that only the thin-film transistor and ROM code transistor portions will be opened, as shown in FIG. 3(h). Then, using fluoric acid etc., the gate oxide film 9 is removed from the thin-film transistor and ROM code transistor portions, after which a gate oxide film 10 with a film thickness of the order of, for example, 8 nm, is newly formed on the entire surface, as shown in FIG. 4i.

By this gate oxide film 10, the gate oxide film 10 of an optimum film thickness can be formed on the thin-film transistor and on the ROM code transistor. For the thick-film transistor portion, the gate oxide film 10, formed by the present step, is added to the gate oxide film 9 formed in the previous step (g) to complete the oxide film of the desired thick thickness.

A gate electrode 11 then is formed on the respective gate oxide films 9, 10, as shown in FIG. 4j, whereby the basic configuration of a semiconductor device comprised of co-existing dual power source transistors and the ROM code transistor is completed.

Thus, in the present example, the processing, described previously, can be completed by performing resist pattern formation five times, by carrying out the code phosphorous implantation for the formation of the inversion layer 13 of the ROM code transistor and the implantation in the P-channel of the thin-film transistor in the same process.

Specifically, if the ion implantation for the respective areas is to be performed by independent processes, at least six resist formation steps are required for the resist pattern formation. That is, four resist forming steps for the formation of the well regions for the P channel and N channel regions of the thick-film transistors and the thin-film transistor and the well region for the ROM code transistor, one resist forming step for forming the inversion layer 13 of the ROM code transistor and one resist forming step for forming the gate oxide film of the thin-film transistor, are required. In the present example, the number of times of the resist pattern forming steps is five, such that the time-consuming resist pattern forming step, such as resist coating, light exposure, development or resist removal, can be curtailed, and hence the number of producing steps, can be reduced.

In the present example, the description has been made of the configuration comprised of co-existence of the thin-film and thick-film transistors of the dual power source type. The present invention is, however, not limited to this configuration and may be applied to any semiconductor device of the configuration in which implantation for the formation of the inversion layer 13 of the ROM code transistor and that for the formation of wells of other transistors can be carried out simultaneously. For example, the favorable effect similar to that described above can obviously be achieved for the configuration comprised only of the thin-film CMOS transistors and the ROM code transistor(s).

Figure 5A:
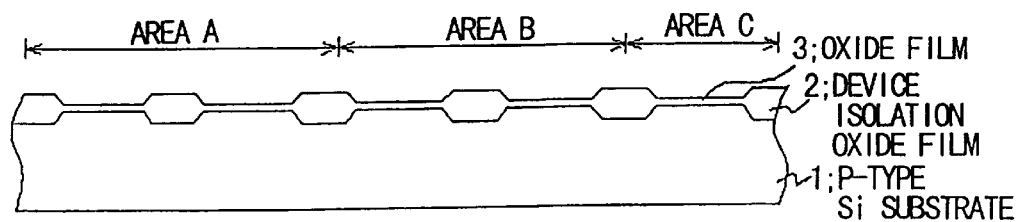
FIGS. 5(a)–5(d) are cross-sectional views for illustrating the process schematically illustrating a portion of the producing method of a semiconductor device according to a second embodiment of the present invention.
Figure 5B:
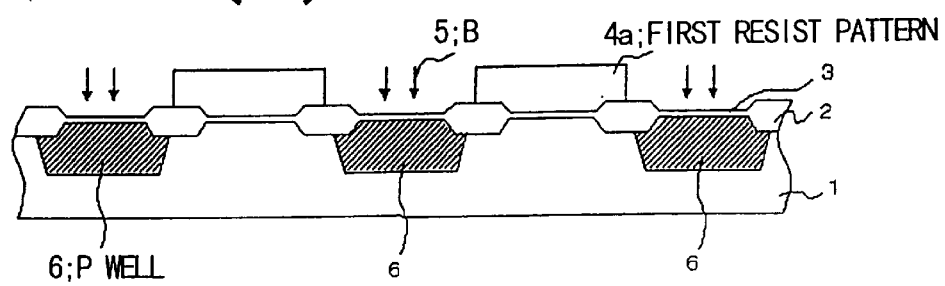
Figure 5C:
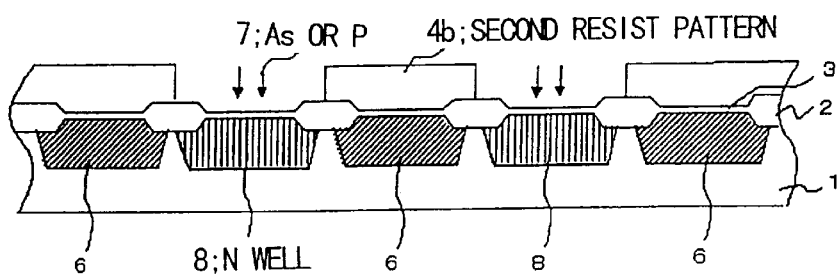
Figure 5D:
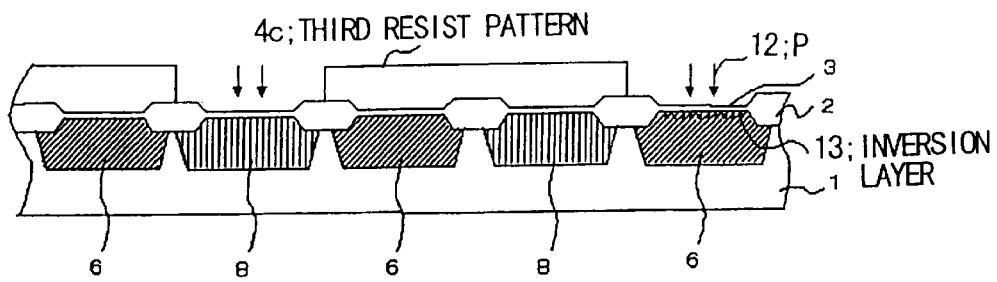
Figure 6:
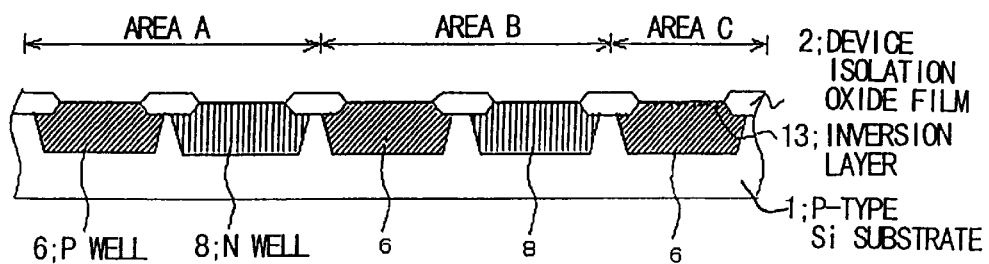
FIGS. 6(e)–6(h) are cross-sectional views for illustrating the process schematically illustrating another portion of the producing method of a semiconductor device according to the second embodiment of the present invention.
Figure 6:
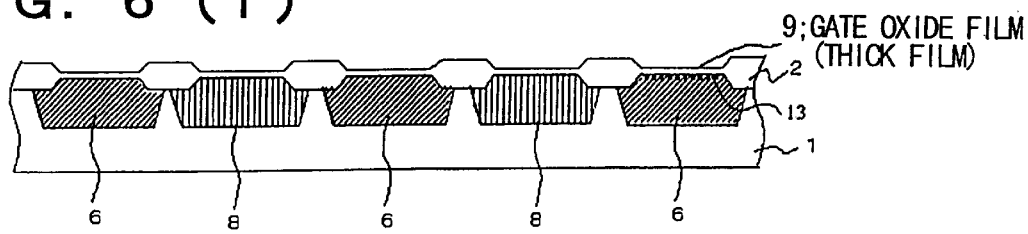
Figure 6:
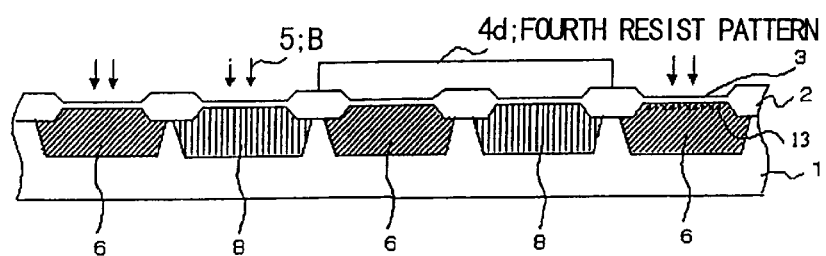
Figure 6:
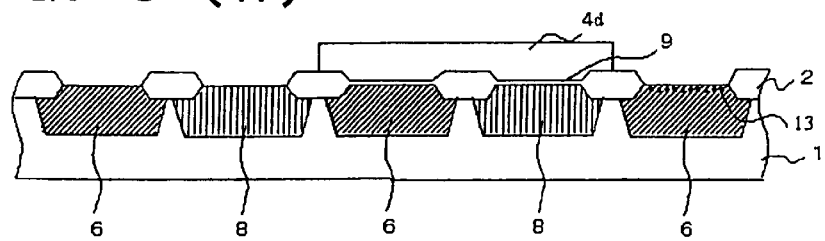

Referring first to FIGS. 5 to 7, a producing method for a semiconductor device according to a second example of the present invention is explained. FIGS. 5 to 7 show cross-sectional views of the process for producing the dual power source type CMOS transistors having an added ROM function according to a second example of the present invention. Although shown in the three figures of FIGS. 5 to 7, the process steps represent the sole one sequence of the producing process.

Similarly to the above-described first example, the present example is pertinent to the process up to the formation of a gate electrode in the producing method for the dual power source type CMOS transistors having the added ROM function. However, in the present example, ion implantation for additional implantation of the thin-film transistor is effected using a resist pattern for forming the gate oxide film of the thin-film transistor to reduce the number of process steps further.

Referring to FIGS. 5 to 7, the producing method for the semiconductor device of the present example is explained. As in the above-described first example, an isolated oxide film 2 and an oxide film 3 are formed on a P-type substrate 1 (see FIG. 5(a)). A first resist pattern 4a then is formed to lay open only the N channel region of the thin-film transistor, the N-channel region of the thick-film transistor and the ROM code transistor, and ions, such as boron 5, are implanted plural times under varied implantation conditions to form P wells 6 in the P type substrate 1 as well as to determine a threshold value of the N-channel of the thick-film transistor.

Meanwhile, in the present example, P wells are formed simultaneously in a thick-film transistor region and in a thin-film transistor region, and the concentration of impurities in a surface area is adjusted in a subsequent step by additional implantation for the thin-film transistor side. Thus, in the present process, the ion implantation conditions are tuned to those for the thick-film transistor, such that, if the ion species is boron, it is implanted under a condition of, e.g., an energy of the order of 200 keV and a dosage of the order of $2E13$ $cm^{-2}$ to form the P wells, while being implanted under a condition of an energy of the order of 30 keV and a dosage of $2E12$ $cm^{-2}$ to determine the threshold value of the N channel of the thick-film transistor.

Then, a second resist pattern 4b is formed so as to lay open only the P-channel region of the thin-film transistor and the P-channel region of the thick-film transistor, as shown in FIG. 5(c). Arsenic or phosphorus 7 then is implanted plural times, under varied conditions, using the ion implantation method, to form N wells 8 in the P-type substrate 1, whilst a threshold value of the P-channel in the thick film transistor. Also in this process, N wells 8 are formed simultaneously in the thick-film transistor area and in the thin-film transistor area, and the thin film side is additionally implanted with ion species in the subsequent process. Therefore, the ion implantation conditions are tuned to hose for the thick-film transistor, such that, if the ion species is phosphorous, it is implanted, e.g., under a condition of an energy of the order of 500 keV and a dosage of the order of 2E13 $cm^{-2}$ to form the N wells, while it is implanted under a condition of an energy of the order of 70 keV and the dosage of the order of 2E12 $cm^{-2}$ to determine the threshold value of the P-channel of the thick-film transistor.

In the above-described first example, the ion species is additionally implanted in the N channel of the thin-film transistor, using an independent resist pattern as a mask. In the present example, since the additional implantation in the N-channel of the thin-film transistor is carried out by a resist pattern used for the formation of the gate oxide film of the thin-film transistor, as later explained, it is unnecessary to form a resist pattern for the additional implantation.

Then, after the second resist pattern 4b has been removed, a photoresist is again formed on the entire surface, as shown in FIG. 5(*d*). A third resist pattern 4c is then formed so as to lay open only the P channel region of the thin-film transistor and the ROM code transistor area, and phosphorous 12 is implanted to adjust the concentration of impurities in the P-channel region of the thin-film transistor as well as to form an inversion layer 3 on the P-well surface of the ROM code transistor.

Whether the ROM code transistor is to be of the enhancement type or the depletion type is determined depending on what kind of ROM code is to be formed, as discussed above, with the enhancement type and the depletion type co-existing for the entire ROM code transistor area. As for the enhancement type region, it suffices if the ROM code transistor region concerned is also protected with the third resist pattern 4c.

Then, using fluoric acid etc, the oxide film 3 formed on the entire surface is removed, and a gate oxide film 9 is formed on the entire surface to a thickness of the order of, e.g., 10 nm (see FIGS. 6e and 6f). As for the thin-film transistor and the ROM code transistor areas, the gate oxide film is again formed in the subsequent process. Thus, in the present process, the film thickness of the gate oxide film 9 is set so as to be equal in the film thickness to the thick-film transistor.

Then, as shown in FIG. 6g, the fourth photoresist pattern 4d is formed so that only the thin-film transistor and the ROM code transistor of the area A will be opened. The present example is characterized in that the ion implantation also is carried out using the fourth photoresist pattern 4d.

That is, the additional implantation in the N-channel of the thin-film transistor, carried out at the step of (d) of the above-described first example, is carried out using the fourth photoresist pattern 4d to reduce the number of resist pattern forming process steps. By this ion implantation, primarily aimed at adjusting the concentration of impurities in the N-channel region of the thin-film transistor, ions are implanted simultaneously in the P channel of the thin-film transistor and in the ROM code transistor. It is noted that, by adjusting the dosage of ion implantation at the steps (b) to (d), each well can be adjusted to an optimum concentration of impurities.

After the ion implantation, the gate oxide film 9 of the thin-film transistor and the ROM code transistor is removed, directly using the fourth photoresist pattern 4d, to newly form the gate oxide film 10 with the film thickness of the order of 8 nm, as shown in FIG. 7i. Then, gate electrodes 11 are formed on the gate oxide films 9 and 10 to complete the basic configuration of the semiconductor device in which the dual power source transistors and the ROM code transistor exist together.

Thus, in the present example, in which the code phosphorous implantation and additional implantation in the P-channel of the thin-film transistor for forming the inversion layer 13 of the ROM code transistor are carried out in one process step, and additional implantation in the N-channel of the thin-film transistor is carried out using the fourth photoresist pattern 4d of the process step for forming the gate oxide film 10 of the thin-film transistor, the above-described processing can be completed by only four resist pattern forming operations.

That is, in the conventional producing method, at least six resist pattern forming steps, namely four resist forming steps for well formation, one resist forming step for forming the inversion layer 13 of the ROM code transistor and one resist forming step for forming the gate oxide film of the thin-film transistor, are required. In the present example, it is possible to produce a semiconductor device of the structure similar to the conventional structure by four times of the resist pattern forming operations, thus further reducing the number of process steps as compared to that in the above-described first example.

In the present example, description has been made of the configuration comprised of co-existence of the thin-film and thick-film transistors of the dual power source type. The present invention is, however, not limited to this configuration and may be applied to any semiconductor device having a thin-film transistor and a thick-film transistor of the dual power source type in which implantation for the formation of the inversion layer 13 of the ROM code transistor and that for the formation of wells of the other transistors can be carried out simultaneously.

Figure 8:
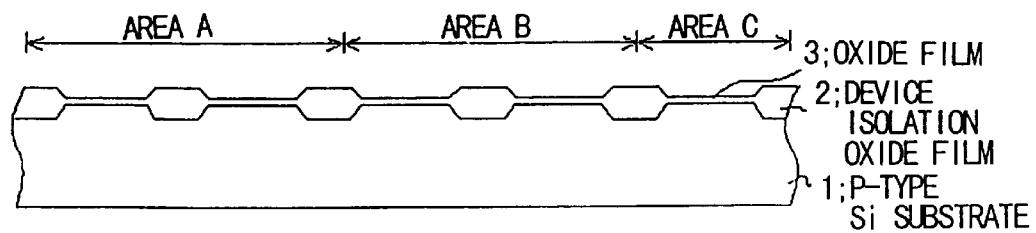
FIGS. 8(a)–8(d) are cross-sectional views for illustrating the process schematically illustrating a portion of the producing method of a semiconductor device according to a third embodiment of the present invention.
Figure 8:
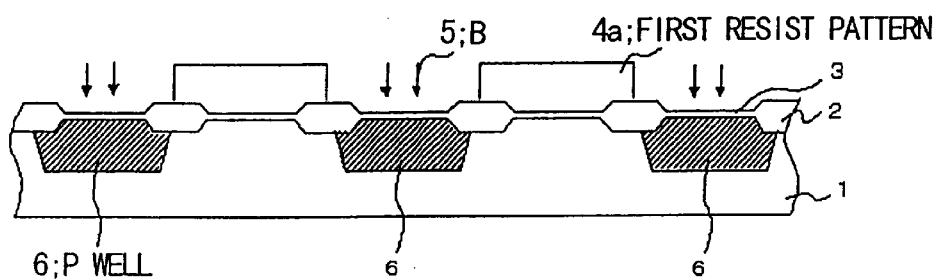
Figure 8:
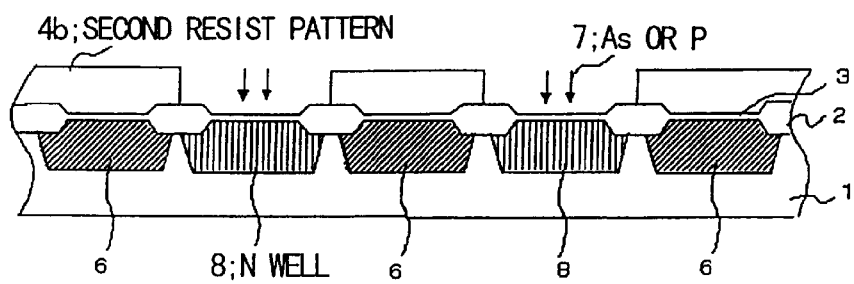
Figure 8:
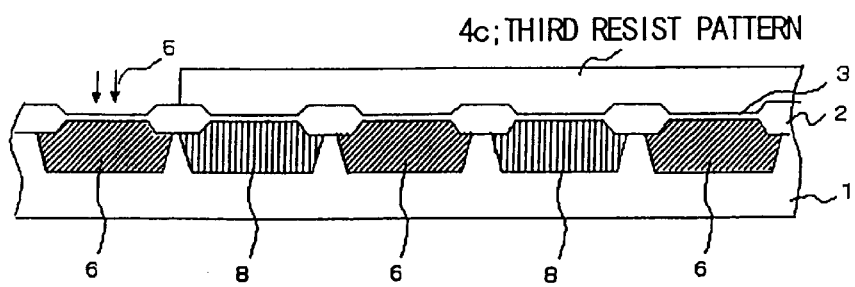
Figure 9:
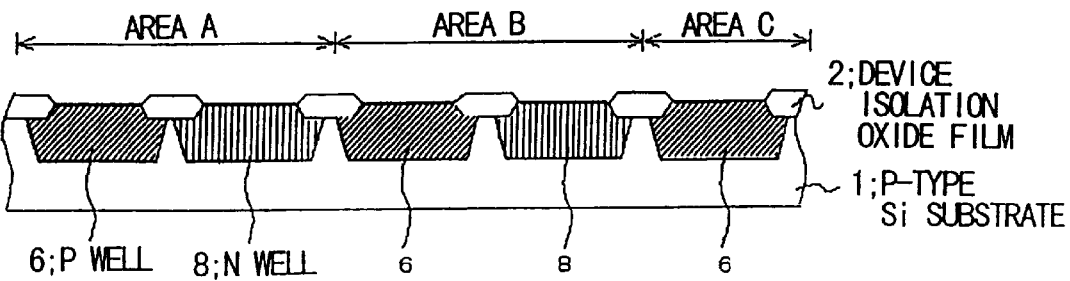
FIGS. 9(e)–9(h) are cross-sectional views for illustrating the process schematically illustrating another portion of the producing method of a semiconductor device according to the third embodiment of the present invention.
Figure 9:
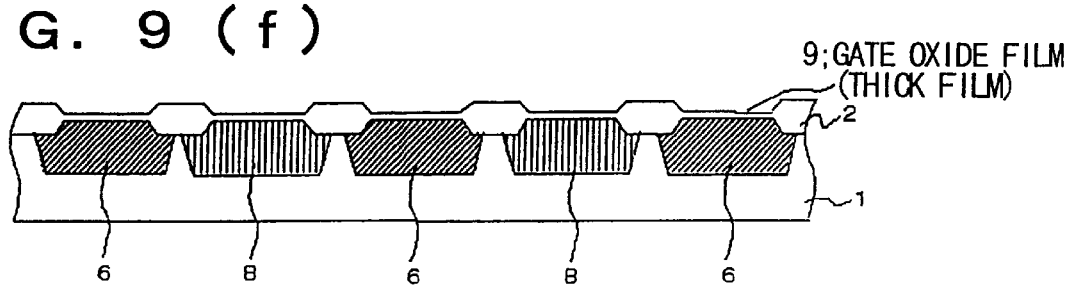
Figure 9:
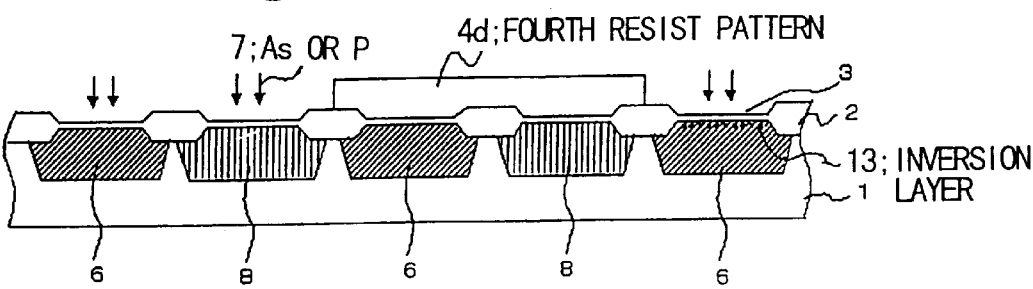
Figure 9:
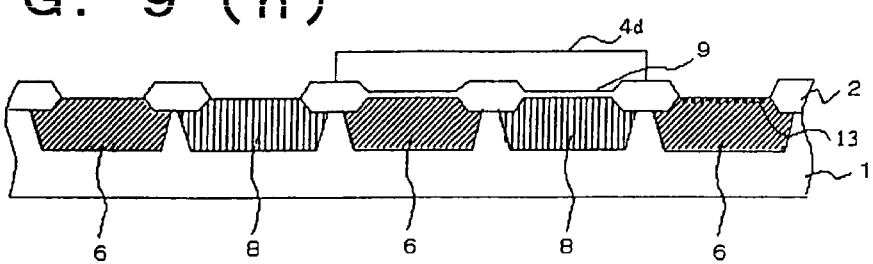
Figure 10I:
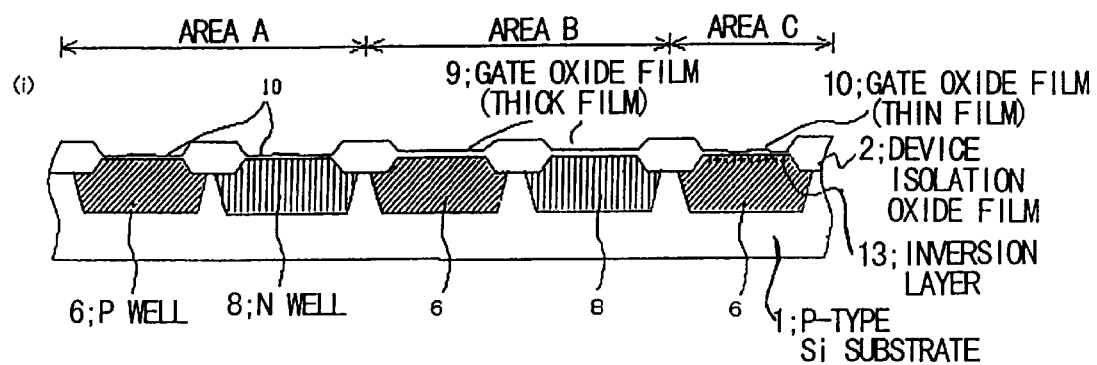
FIGS. 10(i)–10(j) are cross-sectional views for illustrating the process schematically illustrating still another portion of the producing method of a semiconductor device according to the third embodiment of the present invention.
Figure 10J:
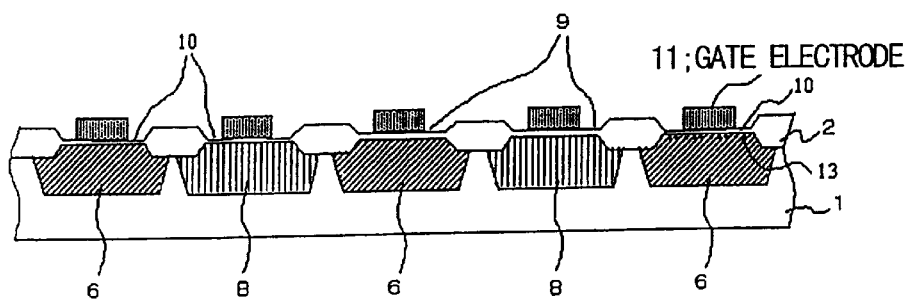

Referring first to FIGS. 8 to 10, the producing method for a semiconductor device according to a third example of the present invention is explained. FIGS. 8 to 10 show, in cross-sectional views, the process for producing the dual power source type CMOS transistors having an added ROM function according to a third example of the present invention. Although shown in the three figures of FIGS. 8 to 10, the process steps represent the sole one sequence of the producing process.

Similarly to the above-described first and second examples, the present example is pertinent to the process up to the formation of a gate electrode in the producing method for dual power source type CMOS transistors having the added ROM function. However, in the present example, the ion implantation for forming the inversion layer of the ROM code transistor is performed using a resist pattern for forming the gate oxide film of the thin-film transistor.

Referring to FIGS. 8 to 10, the producing method for the semiconductor device of the present example is hereinafter explained. As in the above-described second example, an isolation oxide film 2, an oxide film 3, and P wells 6 and N-wells 8 for a thin-film transistor, a thick-film transistor and a ROM code transistor are formed on the P-type substrate 1 (see FIGS. 8(*a*) to 8(*c*)).

In the above-described second example, the ion implantation is effected for forming the inversion layer 13 of the ROM code transistor. The present example is characterized in that the inversion layer 13 of the ROM code transistor is formed using a resist for forming a gate oxide film for a thin-film transistor as later explained.

Instead, a third resist pattern 4c is formed so as to lay open only the N channel of the thin-film transistor, as shown in FIG. 8d. Then, boron 5 etc. is implanted to adjust the concentration of impurities of the N channel area of the thin-film transistor.

The oxide film 3, formed on the surface, is then removed, and the gate oxide film 9 is formed on the entire surface to a film thickness of, e.g., the order of 10 nm. The fourth photoresist pattern 4d then is formed so as to lay open only the thin-film transistor and the ROM code transistor portions of the areas A and C (see FIGS. 9(e) to 9(g)).

In the present example, the formation of the inversion layer 13 of the ROM code transistor and the additional implantation in the P channel of the thin-film transistor are carried out using the fourth photoresist pattern 4d to reduce the number of the resist pattern forming steps. Although ions are implanted simultaneously in the N-channel of the thin-film transistor, each well can be adjusted to an optimum impurity concentration by adjusting the dosage of ion implantation in the step (d).

After the ion implantation, the fourth photoresist pattern 4d is directly used to remove the gate oxide film 9, and the gate oxide film 10 having a thickness, e.g., of the order of 8 nm is newly formed on the entire surface, at the same time as the gate electrodes 11 are formed on the gate oxide films 9 and 10 to complete the basic configuration of the semiconductor device comprised of the dual power source transistors and the ROM code transistor.

Thus, in the present embodiment, the above-mentioned basic configuration of the semiconductor device can be performed with only four times of resist pattern formation by effecting the ion implantation for forming the inversion layer 13 of the ROM code transistor and the additional implantation in the P channel of the thin-film transistor using the resist used for forming the gate oxide film of the thin-film transistor.

That is, at least six times of resist pattern forming operations are required in the conventional method, whereas, in the present embodiment, the semiconductor device of a structure similar to the conventional structure can be formed with four times of the resist pattern forming operations, thus reducing the number of producing process steps, as in the above-described second example.

Although the present example is directed to an instance in which the thin-film and thick-film dual power source CMOS transistors co-existing with the ROM code transistor, similar effects can evidently be produced if the semiconductor device is such a one in which ion implantation for forming the inversion layer 13 of the ROM code transistor and ion implantation for forming the wells of other transistors can be performed using the resist used for forming the gate oxide film of the thin-film transistor.

The meritorious effects of the present invention are summarized as follows.

With the configuration of the present invention, as described above, since the ion implantation for the formation of the inversion layer of the ROM code transistor is exploited to effect additional implantation for other MOS transistors simultaneously, the number of process steps can be reduced with advantage in a semiconductor device in which MOS transistors and ROM code transistors exist together.

Also, in the dual power source semiconductor device, in which thin-film transistors and ROM code transistors co-exist, the number of the producing process steps can further be reduced by additionally implanting ions in the N channel of the thin-film transistor by employing a resist pattern used for forming a gate oxide film of a thin-film transistor, or by performing ion implantation for forming the inversion layer of the ROM code transistor and the additional implantation in the P channel of the thin-film transistor.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for producing a semiconductor device having, as constituent elements, at least five sorts of MOS transistors including a thin-film CMOS transistor, a thick-film CMOS transistor and a ROM code transistor, comprising:

performing ion implantation for forming an inversion layer on a channel surface of said ROM code transistor, and performing in the same process step, ion implantation for adjusting a threshold value voltage of said thin-film transistor, wherein concentrations of impurities on channel surfaces of said five sorts of MOS transistors are adjusted using only four resist pattern forming operations.

2. A method for producing a semiconductor device having, as constituent elements, at least five sorts of MOS transistors including a thin-film CMOS transistor, a thick-film CMOS transistor and a ROM code transistor, comprising:

performing ion implantation for forming an inversion layer on a channel surface of said ROM code transistor, and performing, in the same process step, ion implantation for adjusting a threshold value voltage of said thin-film transistor, wherein the ion implantation for adjusting a threshold value voltage of said thin-film transistor is effected using a resist pattern used for forming a gate oxide film for said thin-film transistor such that concentrations of impurities on channel surfaces of said five sorts of MOS transistors are adjusted using only four resist pattern forming operations.

3. A method for producing a semiconductor device comprising:

(a) implanting an N channel area of a thin-film CMOS transistor, an N channel area of a thick-film CMOS transistor and an area of a ROM code transistor of a semiconductor device having at least five sorts of MOS transistors including thin-film of MOS transistors, thick-film CMOS transistors and the ROM code transistor, with a firs ion species, using a first resist pattern as a mask, to form P wells;

(b) implanting a P channel area of a thin-film CMOS transistor and a P channel of a thick-film CMOS transistor with a second ion species, using a second resist pattern as a mask, to form N wells;

(c) additionally implanting the N channel area of said thin-film CMOS transistor with said first ion species, using a third resist pattern as a mask; and (d) implanting the P channel area of said thin-film CMOS transistor and said ROM code transistor area with said second ion species, using a fourth resist pattern as a mask, to form an inversion layer on a channel surface of said ROM code transistor, and performing additional implantation in the P channel of said thin-film CMOS transistor.

4. A method for producing a semiconductor device comprising:

(a) implanting an N channel area of a thin-film CMOS transistor, an N channel area of a thick-film CMOS transistor and an area of a ROM code transistor of a semiconductor device having at least five sorts of MOS transistors including a thin-film CMOS transistor, a thick-film CMOS transistor and the ROM code transistor, with a first ion species, using a first resist pattern as a mask, to form P wells;

(b) implanting a P channel area of a thin-film CMOS transistor and a P channel of a thick-film CMOS transistor with a second ion species, using a second resist pattern as a mask, to form N wells;

(c) implanting the P channel area of said thin-film CMOS transistor and said ROM code transistor area with said second ion species, using a third resist pattern as a mask, to form an inversion layer on a channel surface of said ROM code transistor, and simultaneously performing an additional implantation in the P channel of said thin-film CMOS transistor;

(d) forming a thick gate oxide film on the entire surface of said substrate and forming a fourth resist pattern to cover only said thick film CMOS transistors;

(e) implanting said first ion species, with said fourth resist pattern as a mask, for additional implantation in the N channel of said thin-film CMOS transistor, and removing the gate oxide films of said thin-film CMOS transistors and said ROM code transistor, using said fourth resist pattern; and (f) forming a thin gate oxide film on said thin-film CMOS transistors and said ROM code transistor.

5. A method for producing a semiconductor device comprising:

(a) implanting an N channel area of a thin-film CMOS transistor, an N channel area of a thick-film CMOS transistor and an area of a ROM code transistor of a semiconductor device having at least five sorts of MOS transistors including a thin-film CMOS transistor, a thick-film CMOS transistor and the ROM code transistor, with a first ion species, using a first resist pattern as a mask, to form P wells;

(b) implanting a P channel area of a thin-film CMOS transistor and a P channel of a thick-film CMOS transistor with a second ion species, using a second resist pattern as a mask, to form N wells;

(c) additionally implanting the N channel area of said thin-film CMOS transistor with said first ion species, using a third resist pattern as a mask;

(d) forming a thick gate oxide film on the entire surface of said substrate, and forming a fourth resist pattern to cover only said thick-film CMOS transistors;

(e) implanting said second ion species, with said fourth resist pattern as a mask, for ion implantation for forming an inversion layer of said ROM code transistor and simultaneously for additional implantation of said P channel of said thin-film CMOS transistor, and subsequently removing the gate oxide films of said thin-film CMOS transistors and said ROM code transistor; and (f) forming thin gate oxide films on said thin film of said CMOS transistor and said ROM code transistor.

6. The method for producing a semiconductor device as defined in claim 3 wherein said first ion species comprises boron and said second ion species comprises arsenic or phosphorous.

7. The method for producing a semiconductor device as defined in claim 6 wherein said second ion species, implantation ions for forming said ROM code transistor comprise phosphorous ions.

* * * * *